United States Patent [19]

Takaoka et al.

[11] 4,145,664
[45] Mar. 20, 1979

[54] AUDIO SIGNAL COMPRESSION AND EXPANSION SYSTEM

[75] Inventors: Saburo Takaoka; Fumihiko Yokogawa; Tadahiro Yamaguchi, all of Tokorozawa, Japan

[73] Assignee: Pioneer Electronic Corporation, Tokyo, Japan

[21] Appl. No.: 892,356

[22] Filed: Mar. 31, 1978

[30] Foreign Application Priority Data

Mar. 31, 1977 [JP] Japan .................................. 52/36446

[51] Int. Cl.² .............................................. H03G 7/08
[52] U.S. Cl. .................................... 330/85; 330/151; 330/254; 330/279; 333/14
[58] Field of Search .................... 330/51, 85, 151, 278, 330/279; 333/14

[56] References Cited

U.S. PATENT DOCUMENTS 3,729,693  4/1973  Dolby ...................................... 333/14

Primary Examiner—James B. Mullins
Attorney, Agent, or Firm—Sughrue, Rothwell, Mion, Zinn and Macpeak

[57] ABSTRACT

The auxilliary signal path in a compander system includes, in series, a first amplifier 7, a weighting function amplifier 8, and a detection circuit 9. The output of the latter controls the gain of a voltage-controlled variable gain circuit 11 also connected to the first amplifier output, and the integrated output of the variable gain circuit is fed back to the input of the first amplifier via a subtraction circuit 13 also supplied with the auxilliary signal path input. Alternatively, the first amplifier may comprise an operational amplifier, in which case the integrated signal is directly coupled to one of its inputs.

3 Claims, 9 Drawing Figures

AUDIO SIGNAL COMPRESSION AND EXPANSION SYSTEM

BACKGROUND OF THE INVENTION

This invention relates to a noise reducing transmission system whose transfer characteristic is obtained by additively or subtractively combining the outputs of main and auxiliary signal paths, and more particularly to a signal compression and expansion circuit (compander) for such a transmission system.

In most noise reducing systems for audio equipment, a signal is subjected to compression and expansion to improve its S/N ratio and dynamic range. One example of such a noise reducing system utilizing the sum and difference between main and auxiliary signals has been proposed by the Dolby Company. In this system the auxiliary signal path has a high-pass filter characteristic, and the overall system characteristic is essentially that of an all-pass filter at low signal levels but a high-pass or low-pass filter at high signal levels. Accordingly, noise is reduced over a wide band in the case of low signal levels, and therefore such a conventional system is effective in acoustic devices using magnetic tapes or disks.

FIG. 1 shows a block diagram of a signal compression and expansion transmission system employing a sum and difference technique. If the gain of the main signal path is unity, and the transmission function of the auxiliary signal path is represented by F(s), the signal compression and expansion processes can be expressed by the following two equations, respectively:

$$\frac{E_r}{E_i}(s) = 1 + F(s) \quad (1)$$

$$\frac{E_o}{E_r}(s) = \frac{1}{1+F(s)} \quad (2)$$

From these equations it can be seen that $E_o(s) = E_i(s)$, and thus the output signal is equal to the input signal.

A conventional signal compression and expansion circuit is shown in FIG. 2, wherein a signal $E_i(s)$ or $E_r(s)$ is applied to an input terminal 1 connected to one input of an adder 2. The adder output is connected to the input of a negative phase amplifier 3, whose output is connected to the circuit output terminal 4. The above-described elements form the main signal path of the circuit. On the other hand, the auxiliary signal path is formed by a change-over switch 5, a high-pass filter 6, a positive phase amplifier 7, a weighting function amplifier 8, a detection circuit 9, and a variable impedance element 10.

In such a circuit the reception impedance of the high-pass filter 6 is controlled by the variable impedance element 10, and signal detection is performed on the weighted output of the amplifier 7 by the detection circuit 9 to thereby obtain a control voltage for the variable impedance element. The control voltage is a DC voltage proportional to the magnitude of the signal level and to the frequency characteristics of the weighting function amplifier 8. As a result, a frequency characteristic corresponding to the signal level of the entire auxiliary signal path is obtained to implement signal compression and expansion.

When the circuit of FIG. 2 is employed on the transmitting side the armature of switch 5 is set on contact 5a; when it is employed on the receiving side the armature is set on contact 5b.

In such a conventional circuit the high-pass filter utilizes passive RC elements and a variable impedance element such as an FET or a voltage-controlled variable resistance circuit. It is thus necessary that the control voltage correctly correspond to the resistance variation characteristic. Since the variable impedance elements have fluctuating characteristics, however, even if they are FET's, it is difficult to satisfy this condition. Further, in such a system the variable resistance characteristic of an FET varies the overall impedance value. Therefore, it is necessary to provide the same number of passive elements in the high-pass filter as in a conventional device, and in forming an integrated circuit such passive elements are external to the circuit. This greatly contributes to the manufacturing cost.

SUMMARY OF THE INVENTION

According, an object of this invention is to eliminate all of the above-described difficulties accompanying the conventional device, and more specifically to provide a signal compression and expansion device which may be suitably formed as an integrated circuit, in which the number of components which must be externally connected to the circuit are reduced, and wherein the fluctuation characteristics of the elements are reduced.

Briefly, and in accordance with the present invention, the auxiliary signal path in a compander system includes, in series, a first amplifier, a weighting function amplifier, and a detection circuit, just as in the prior art. The output of the latter, however, controls the gain of a voltage-controlled variable gain circuit also connected to the first amplifier output, and the integrated output of the variable gain circuit is fed back to the input of the first amplifier via a subtraction circuit also supplied with the auxiliary signal path input. Alternatively, the first amplifier may comprise an operational amplifier, in which case the integrated signal is directly coupled to one of its inputs.

DETAILED DESCRIPTION OF THE PREFERRED EMBODIMENTS

Figure 1:
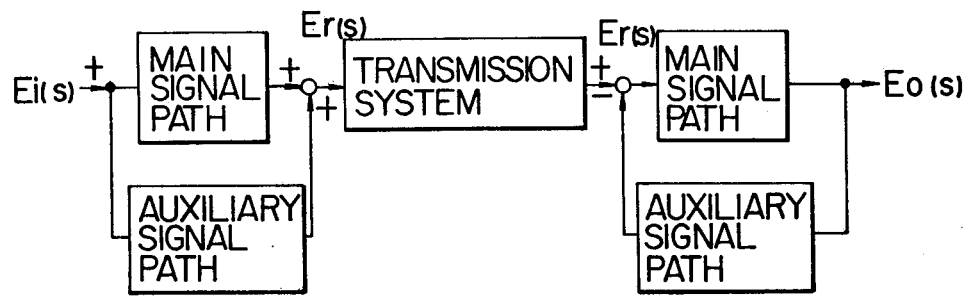
FIG. 1 shows a block diagram of a standard transmission system employing signal compression and expansion means.
Figure 2:
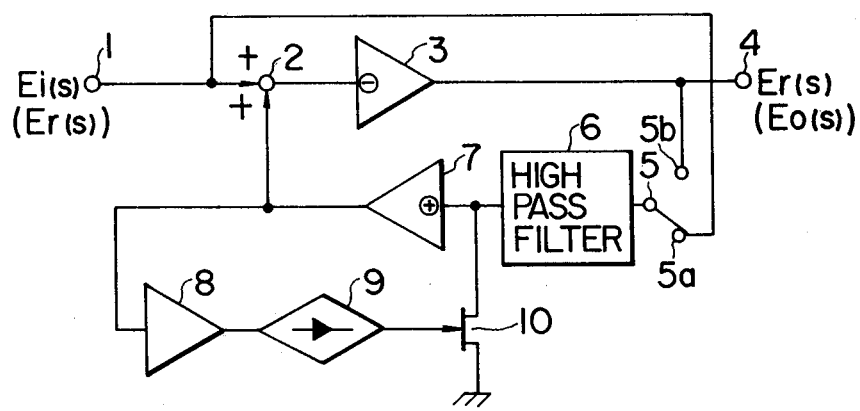
FIG. 2 shows a block diagram of a conventional signal compression and expansion circuit.
Figure 3:
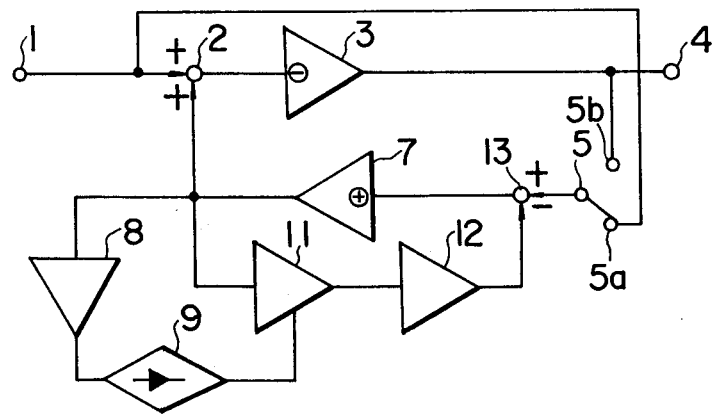
FIG. 3 shows a block diagram of one embodiment of a signal compression and expansion circuit according to the invention.

FIG. 3 shows one embodiment of a signal compression and expansion device according to the invention, which is obtained by replacing the high-pass filter 6 and variable impedance element 10 in FIG. 2 with a voltage-controlled variable gain circuit 11 and an integrator 12 connected in series in the feedback circuit of the amplifier 7. The variable gain circuit 11 is controlled by the output of the detection circuit 9, and the remaining circuit elements in FIG. 3 are similar to those in FIG. 2. In other words, the auxiliary signal path of the signal compressing and expanding device according to this embodiment of the invention comprises the amplifier 7, a weighting function amplifier 8 connected to the output of amplifier 7, a detection circuit 9 for detecting the output of the weighting function amplifier, a variable gain circuit 11 which amplifies the output of amplifier 7 under the control of the detection circuit 9, and an integration circuit 12 which integrates the output of the variable gain circuit 11 and feeds back such integrated output to the input of the amplifier 7 through a subtraction circuit 13. Thus, the signal is compressed or expanded with the aid of a DC voltage corresponding to the level and frequency of an input signal.

Figure 6A:
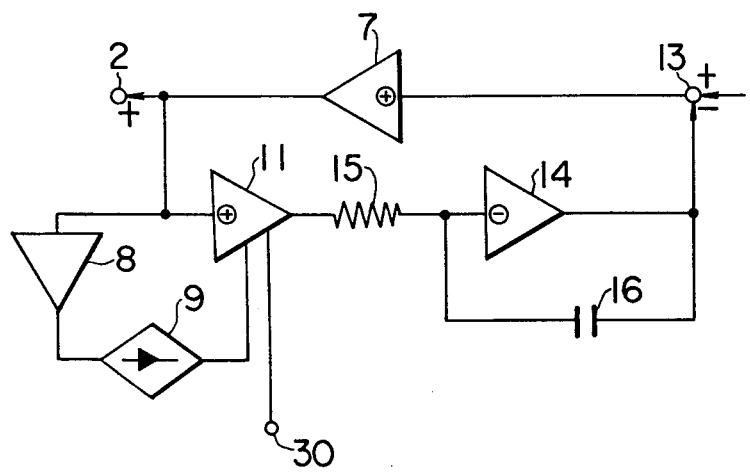
Figure 6B:
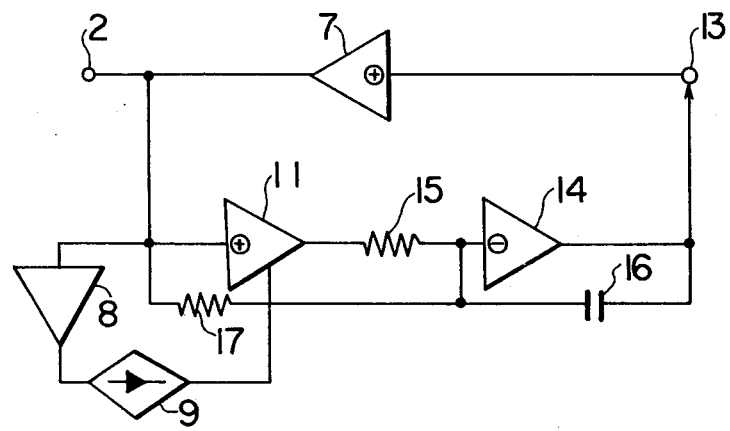
Figure 6C:
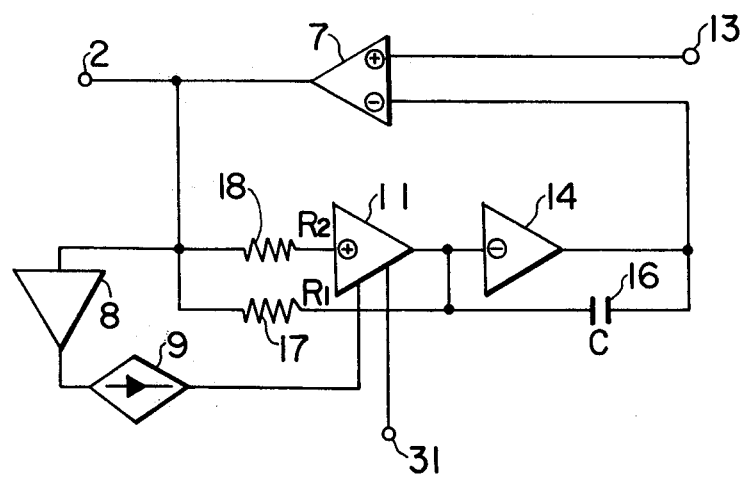

If the amplifier 7 is an operational amplifier one of whose input terminals is connected to the output of the integration circuit 12 and whose other input terminal is connected to the switch 5, then the subtraction circuit 13 may be eliminated, as shown in FIG. 6c.

Figure 4:
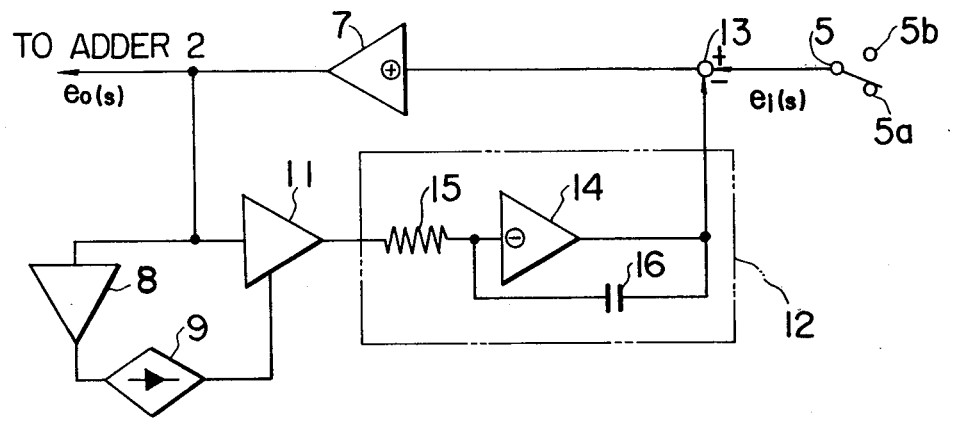
FIG. 4 shows a block diagram of the integration circuit in FIG. 3.

The integration circuit 12, as shown in FIG. 4, may comprise an operational amplifier 14, a resistor 15, and a capacitor 16. In operation, if it is assumed that the input signal to the switch 5 is $e_i(s)$; the gain of the amplifier 7 is K; the output signal to the adder 2 is $e_o(s)$; the gain of the voltage-controlled variable gain circuit 11 is x; the resistance of resistor 15 is R; and the capacitance of capacitor 16 is C, then the transfer function of the circuit shown in FIG. 4 can be expressed as follows:

$$\frac{e_o}{e_i}(s) = \frac{sK}{s + K\frac{x}{RC}} \quad (\equiv \frac{sK}{s + Kx\omega_o}) \quad (3)$$

where $\omega_o = 1/RC$ (4)

Figure 5:
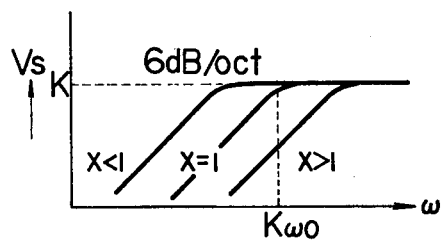
FIG. 5 shows a plot of the gain vs. angular frequency characteristics of the circuit shown in FIG. 4, FIGS. 6a, 6b and 6c show block diagrams of various auxiliary signal path embodiments.

The gain vs. angular frequency characteristic of equation (3) is plotted in FIG. 5, which shows a high-pass filter having an angular frequency cut-off of $K\omega_o$ when $x = 1$. When $x < 1$ and $> 1$, the angular frequency cut-off varies, and such variance can be controlled by varying the gain of the voltage-controlled circuit 11.

By utilizing this principle, circuitry for replacing the conventional high-pass filter can be realized, and in addition a frequency characteristic corresponding to the signal level in the auxiliary signal path can be obtained by changing the frequency characteristic of the weighting function amplifier 8 as desired.

It it is assumed that the weighting function is represented by G(s), then the relationship between the weighting function and the gain x can be expressed as follows:

$$x = G(s) \cdot e_o(s) \quad (5)$$

From equations (3) and (5), the following equation can be obtained:

$$e_i(s) = \frac{s + K\omega_o G(s) \cdot e_o(s)}{sK} \cdot e_o(s) \quad (6)$$

If a given weighting function is substituted into equation (6), a frequency characteristic corresponding to the signal level can be obtained. Applying the transfer function F(s) of this auxiliary signal path to equations (1) and (2) before, the desired signal compression and expansion can be effected.

In the auxiliary signal path embodiment shown in FIG. 6a, the voltage controlled variable gain circuit 11 has a constant gain setting terminal 30 so that the total gain of the circuit 11 is the sum of the constant gain determined by a predetermined voltage applied to terminal 30 and a variable gain dependent on the output of the detector 9. In other respects the circuit in FIG. 6a is the same as that in FIG. 4.

In the circuit of FIG. 6a, assuming that the constant gain of the voltage controlled variable gain circuit 11 is $X_o$ and the variable gain is X, the transfer function of the auxiliary path in FIG. 6a is as follows:

$$\frac{e_o(s)}{e_i(s)} = \frac{sK}{s + K \cdot \frac{1}{RC}(X_o + X)} \quad (\equiv \frac{sK}{s + K \cdot W_o(X_o + X)}) \quad (7)$$

It is clear from equation (7) that the transfer function is determined by the high angular frequency cut-off term $Kw_o x_o$ when $X << 1$, and it has a specific angular frequency.

FIG. 6b shows a further auxiliary signal path embodiment, wherein a time constant circuit is coupled to the output of amplifier 7 in the form of a resistor 17 connected to capacitor 16 and the input terminal of amplifier 14.

In this embodiment, assuming that the values of resistors 15 and 17 are $R_1$ and $R_2$, the transfer function is as follows:

$$\frac{e_o(s)}{e_i(s)} = \frac{sK}{s + K(\frac{X}{R_1C} + \frac{1}{R_2C})} \quad (\equiv \frac{sK}{s + K(Xw_1 + w_2)}), \quad (8)$$

wherein $w_1 = 1/R_1C$ and $w_2 = 1/R_2C$. It is clear from equation (8) that the high angular frequency cut-off is determined by $Kw_2$ when $X << 1$, and it has a specific value. Since the time constant $R_2C$ is determined only by the value of $R_2$ and is not influenced by other transmission parameters in the auxiliary path, it has a large degree of setting freedom. In this embodiment it is also possible to connect the resistor 15 in series with the input terminal of the varible gain circuit 11.

FIG. 6c shows a still further embodiment of the auxiliary signal path circuit, wherein the voltage controlled variable gain circuit 11 has a constant gain setting terminal 31 so that its total gain is the sum of the constant gain and the variable gain corresponding to the control voltage applied by the detector 9. The circuit 11 is a signal inversion type amplifier having its input connected to a resistor 18. A resistor 17 by-passes the series circuit of the amplifier 11 and resistor 18.

The transfer function of this circuit is as follows:

$$\frac{e_o(s)}{e_o(s)} = \frac{sK}{s + K \cdot \frac{1}{R_1C}(X_o + s - \frac{R_1}{R_2})} \quad (9)$$

The second term of the denominator in the right side of equation (9) shows the high angular frequency cut-off wh, as given by:

$$wh = K \cdot \frac{1}{R_1C} \{(X_o - \frac{R_1}{R_2}) + X\} \quad (10)$$

In equation 10, $(X_o - R_1/R_2)$ corresponds to a constant gain factor of the amplifier 11 which is determined by the resistor 18. That is, with no signal the high angular frequency cut-off is determined by the difference between an initial constant gain and the gain determined by the ratio of resistors $R_1$ and $R_2$. Thus, the high frequency cut-off of the auxiliary path can be determined by the value of resistor 18, and by using a variable resistor therefor it is possible to regulate the frequency characteristics of the circuit in accordance with the level of the signal under compression or expansion.

In the embodiment shown in FIG. 6c in which the variable gain is determined by the ratio of the primary control circuit $I_1$ from the detector 9 to the secondary control current $I_2$ applied to terminal 31, there may be a variation of the offset voltage of the whole auxiliary signal path due to an abrupt increase in the secondary control circuit from zero to a high value. To reduce such variation it is possible to apply an initial secondary control current to provide a constant gain of the amplifier 11, and to cancel out such gain by means of the resistor 18 as previously mentioned. It is also possible to further reduce the variation by connecting a capacitor in series with the resistor 18 so that the constant gain can be cancelled or regulated in an A.C. mode. In this manner, the voltage controlled circuit 11 is provided with a constant gain regulated by the resistor 18 to set the high frequency cut-off of the auxiliary channel. Thus, any offset voltage variation of the auxiliary channel can be reduced and it is possible to regulate the frequency characteristics thereof.

Figure 7:
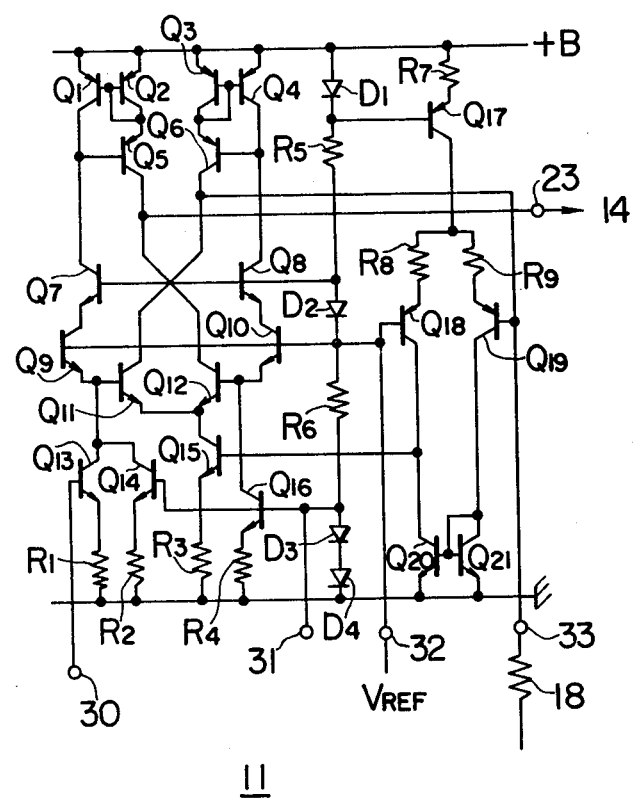
FIG. 7 shows a schematic diagram of a voltage controlled variable gain circuit usable in the embodiment of FIG. 6c.

FIG. 7 shows an example of the voltage controlled variable gain circuit 11 in FIG. 6c. A first control terminal 30 is connected to the output of the detector 9, a predetermined constant gain signal is applied to the second control terminal 31, a predetermined bias voltage is applied to a terminal 32, an input terminal 33 is connected to the resistor 18, and an output terminal 34 is connected to the operational amplifier 14.

In FIG. 7, transistors $Q_{17}$ to $Q_{21}$ and resistors $R_7$ to $R_9$ constitute a differential amplifier. Transistors $Q_1$ to $Q_{16}$ and resistors $R_1$ to $R_4$ constitute a voltage controlled variable gain circuit, and the current gain thereof is determined by the emitter current ratio of transistors $Q_9$ and $Q_{10}$.

What is claimed is:

1. In a signal compression and expansion system having a main signal path and an auxiliary signal path connectable therewith in a feedback or feedforward mode, said auxiliary signal path including amplifier means (7); a weighting function amplifier (8) connected to the output of said amplifier means; and a detection circuit (9) connected to the output of said weighting function amplifier; the improvements characterized by:
    (a) a voltage-controlled variable gain circuit (11) for amplifying the output of said amplifier means;
    (b) means connecting the output of said detection circuit to a gain-control input of said variable gain circuit;
    (c) means (12) for integrating the output of said variable gain circuit; and
    (d) means (13) for feeding back said integrated output to the input of said amplifier means.

2. A system as claimed in claim 1, wherein said feeding back means comprises a subtraction circuit for applying the difference between the output of said integrating means and the input of said auxiliary signal path to the input of said amplifier means.

3. A system as claimed in claim 1, wherein said amplifier means comprises an operational amplifier, and the output of said integrating means is one of two inputs of said operational amplifier.

* * * * *